US006943622B2

(12) United States Patent
Ranganathan

(10) Patent No.: US 6,943,622 B2
(45) Date of Patent: Sep. 13, 2005

(54) INPUT BUFFER AMPLIFIER WITH CENTROIDAL LAYOUT

(75) Inventor: Sumant Ranganathan, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/011,593

(22) Filed: Dec. 15, 2004

(65) Prior Publication Data

US 2005/0093623 A1 May 5, 2005

Related U.S. Application Data

(63) Continuation of application No. 10/347,629, filed on Jan. 22, 2003, now Pat. No. 6,833,756.
(60) Provisional application No. 60/350,341, filed on Jan. 24, 2002.

(51) Int. Cl.[7] ................................................ H03F 3/45
(52) U.S. Cl. ........................................ 330/69; 330/252
(58) Field of Search ............................ 330/69, 252, 253

(56) References Cited

U.S. PATENT DOCUMENTS

| 5,796,301 A | 8/1998 | Tanabe et al. ................ 330/69 |
| 5,990,737 A | 11/1999 | Czarnul et al. ............... 330/69 |
| 5,999,052 A | 12/1999 | Tang .......................... 330/254 |
| 6,429,735 B1 * | 8/2002 | Kuo et al. ................... 330/252 |

OTHER PUBLICATIONS

Copy of International Search Report for Appl. No. PCT/US03/01909, mailed Sep. 10, 2003, 5 pages.

* cited by examiner

Primary Examiner—Khanh V. Nguyen
(74) Attorney, Agent, or Firm—Sterne, Kessler, Goldstein & Fox P.L.L.C.

(57) ABSTRACT

An input buffer amplifier has a symmetrical centroidal layout. The input buffer amplifier includes two half differential amplifiers that have substantially identical layouts. Each half amplifier receives the input signal in-parallel, and the outputs of the differential half amplifiers are wire-ored together. The input buffer amplifier is symmetrical about both horizontal and vertical lines of symmetry. Furthermore, FET devices forming the half amplifiers are interlaced to create the horizontal line of symmetry. The overall horizontal and vertical symmetry of the input buffer amplifier improves the device matching between differential signal paths. In other words, the devices in the half amplifiers that process the positive and negative components of the differential signal are more closely matched. This reduces differential offsets and common mode offsets that can occur when devices are not matched properly. The reduction in differential offset and common mode offset improves the linearity and dynamic range of input buffer amplifier. The improved differential matching also reduces signal distortion and the susceptibility to power supply noise.

20 Claims, 3 Drawing Sheets

INPUT BUFFER AMPLIFIER WITH CENTROIDAL LAYOUT

CROSS-REFERENCE TO RELATED APPLICATIONS

This application claims priority to U.S. patent application Ser. No. 10/347,629, filed Jan. 22, 2003 now U.S. Pat. No. 6,833,756, which claims the benefit of U.S. Provisional Application No. 60/350,341, filed Jan. 24, 2002, both of which are incorporated herein by reference in their entireties.

BACKGROUND OF THE INVENTION

1. Field of the Invention

The present invention generally relates to receivers, and more specifically to an input buffer amplifier having a centroidal layout.

2. Background Art

Receivers often include components that are connected together to process and retrieve data from a received signal. For instance, a typical receiver may include a progranimable gain amplifier, analog mixers, various filters, and an analog-to-digital converter (ADC), all of which are typically connected together in series. The mentioned components operate on the received signal so as to retrieve data that is typically delivered to a processor.

Often times, buffer amplifiers are inserted between the series components of the receiver to insure that the output of one component can sufficiently drive the input of the following component. For instance, a buffer amplifier may be needed to drive the ADC because the sampling performed by the ADC can cause signal distortion. Furthermore, the buffer amplifiers also operate to isolate any impedance mismatches between the receiver components.

In differential receivers, there is a positive signal path and a negative signal path to process the positive and negative components of the received differential signal. It is desirable that the electrical components, including the input buffer amplifier, are matched for the two signal paths. If the electrical components are not matched, then an offset voltage can develop between the two signal paths. Any offset voltage reduces receiver sensitivity to low power signals, and reduces overall receiver performance.

The circuit layout of a differential circuit (including a differential buffer amplifier) can cause the generation of the offset voltage that reduces the electrical performance of the differential circuit. An offset voltage between two differential paths reduces the net available dynamic range in the system. Furthermore, common mode offsets produce distortion in the amplifier.

The differential circuit can produce the unwanted offset voltages if the layout is not symmetrical between the positive and negative paths. This occurs because an unsymmetrical layout produces mismatched components in the two differential paths that cause the unwanted offset voltages. Therefore, what is needed is an input buffer layout that is symmetrical so as not to produce DC offset voltages.

BRIEF SUMMARY OF THE INVENTION

The present invention is an input buffer amplifier that has a symmetrical centroidal layout. The input buffer amplifier includes two half differential amplifiers that have substantially identical layouts. Each half amplifier receives the input signal in-parallel, and the differential outputs of the differential half amplifiers are wire-ored together. The input buffer amplifier is symmetrical about both horizontal and vertical lines of symmetry. In other words, the two half amplifiers are mirror images of each other about a vertical line of symmetry. Furthermore, each half amplifier is also a mirror image of itself about a horizontal line of symmetry. The FET devices forming the half amplifiers are interlaced to create the horizontal line of symmetry.

The horizontal and vertical symmetry of the buffer amplifier improves device matching between differential signal paths. The mentioned symmetry also averages out the effect of any process gradients across the substrate of the input buffer amplifier. In other words, the devices in the half amplifiers that process the positive and negative components of the differential signal are more closely matched. This reduces differential offsets and common mode offsets that can occur when devices are not matched properly. The reduction in differential offset and common mode offset improves the linearity and dynamic range of input buffer amplifier. The improved differential matching also reduces signal distortion and susceptibility to power supply noise.

Further features and advantages of the present invention, as well as the structure and operation of various embodiments of the present invention, are described in detail below with reference to the accompanying drawings.

BRIEF DESCRIPTION OF THE DRAWINGS/FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

1. Example Receiver Application

Before describing the invention in detail, it is useful to describe an example receiver environment for the invention. The input buffer amplifier invention is not limited to the receiver environment that is described herein, as the input buffer amplifier invention is applicable to other receiver and non-receiver applications as will be understood to those skilled in the relevant arts based on the discussions given herein.

Figure 1:
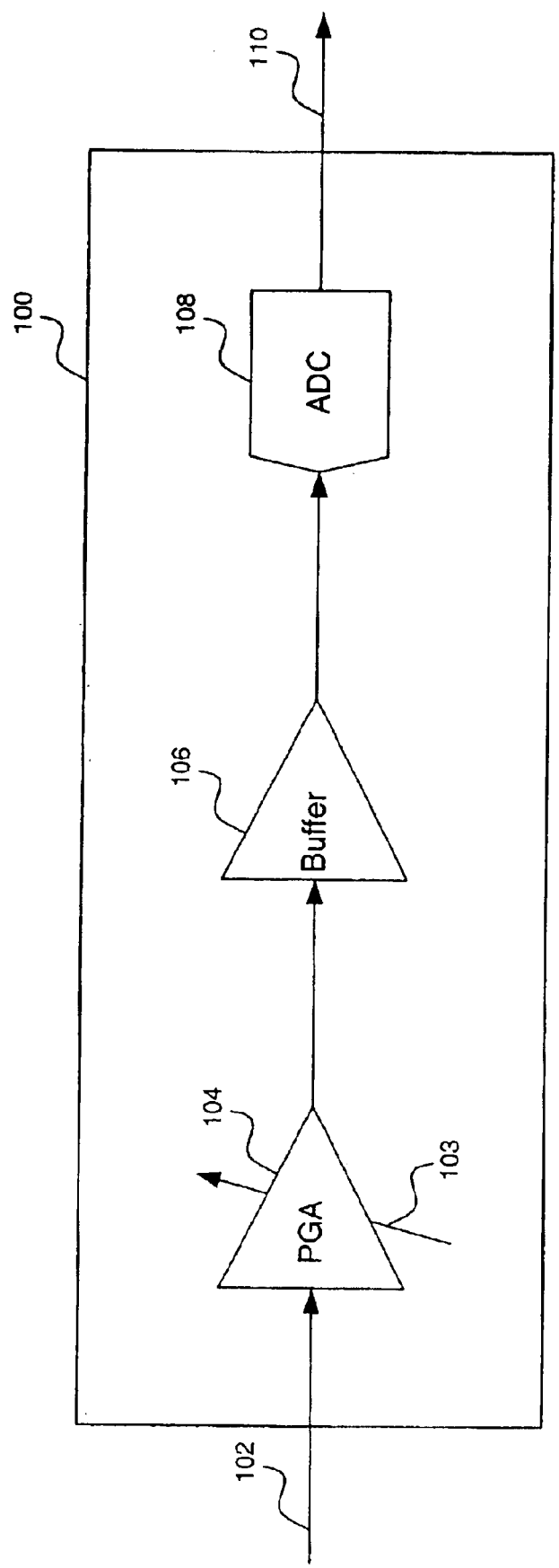
FIG. 1 illustrates an exemplary receiver environment for the input buffer amplifier.

FIG. 1 illustrates a receiver environment 100 that receives an analog signal 102 and produces a digital output signal 110 that is carrying digital data. The digital output signal 110 can be forwarded to a digital processor (not shown) so that the digital data can be recovered and processed.

The receiver 100 includes a programmable gain amplifier (PGA) 104, a buffer amplifier 106, and an analog-to-digital converter (ADC) 108. The PGA 104 receives the analog signal 102 and variably amplifies (or attenuates) the analog signal 102 according to a control signal 103. The buffer amplifier 106 receives the output of the PGA 104 and drives the input of the ADC 108. The buffer amplifier 106 typically has a signal gain of 1, and has sufficient linearity to drive the ADC 108 without causing signal distortion. The ADC 108 samples the output of the buffer amplifier 106, and digitizes the samples to generate the digital output signal 110.

Figure 3:
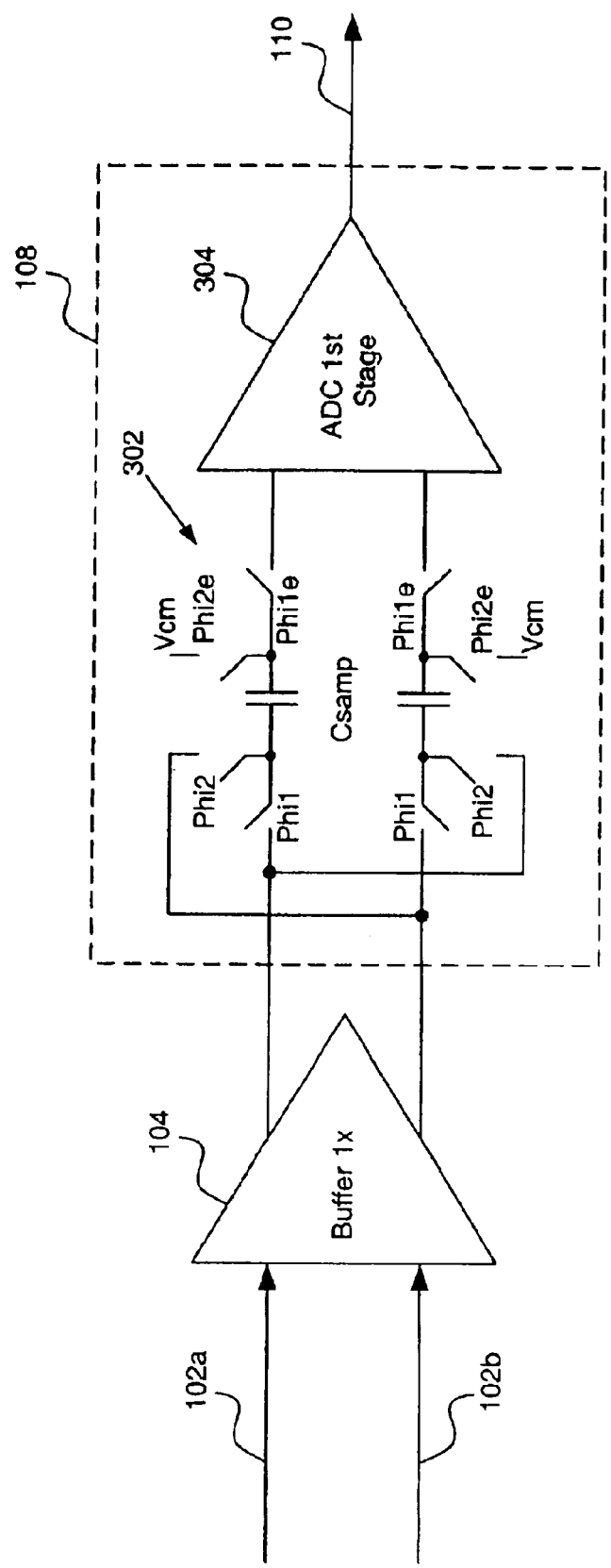
FIG. 3 illustrates a sampling circuit in an analog-to-digital converter.

As discussed above, the buffer amplifier 106 maintains signal linearity prior to sampling by the ADC 108. For example, FIG. 3 illustrates the ADC 108 having a sampling load 302 connected between the output of the input buffer 104 and the input of a first ADC stage 304. The sampling load 302 includes Vcm (i.e., the common mode voltage) and Csamp (i.e., the sampling capacitor). The sampling load 302 is operated according to the control signals Phi__1, Phi__2, Phi__1e, and Phi__2e. The buffer amplifier receives differential input signals 102*a* and 102*b*. The sampling load 302 samples the differential output of the buffer amplifier 104, according to the mentioned control signals. The output of the sampling load is fed to the ADC first stage 304 for quantization, and digitization.

Absent the input buffer 104, the operation of the sampling load 302 would add distortion to the signal that would reduce the performance of the receiver 100. In other words, the input buffer amplifier 104 maintains a highly linear signal while the signal is being sampled. The input buffer amplifier 104 also provides good differential signal matching between the positive and negative components of the differential signal. This produces good common mode rejection, and reduces or prevents any DC offset in the receiver 100. This also improves the rejection of any power supply noise on the differential signal output.

2. The Centroidal Layout

Figure 2:
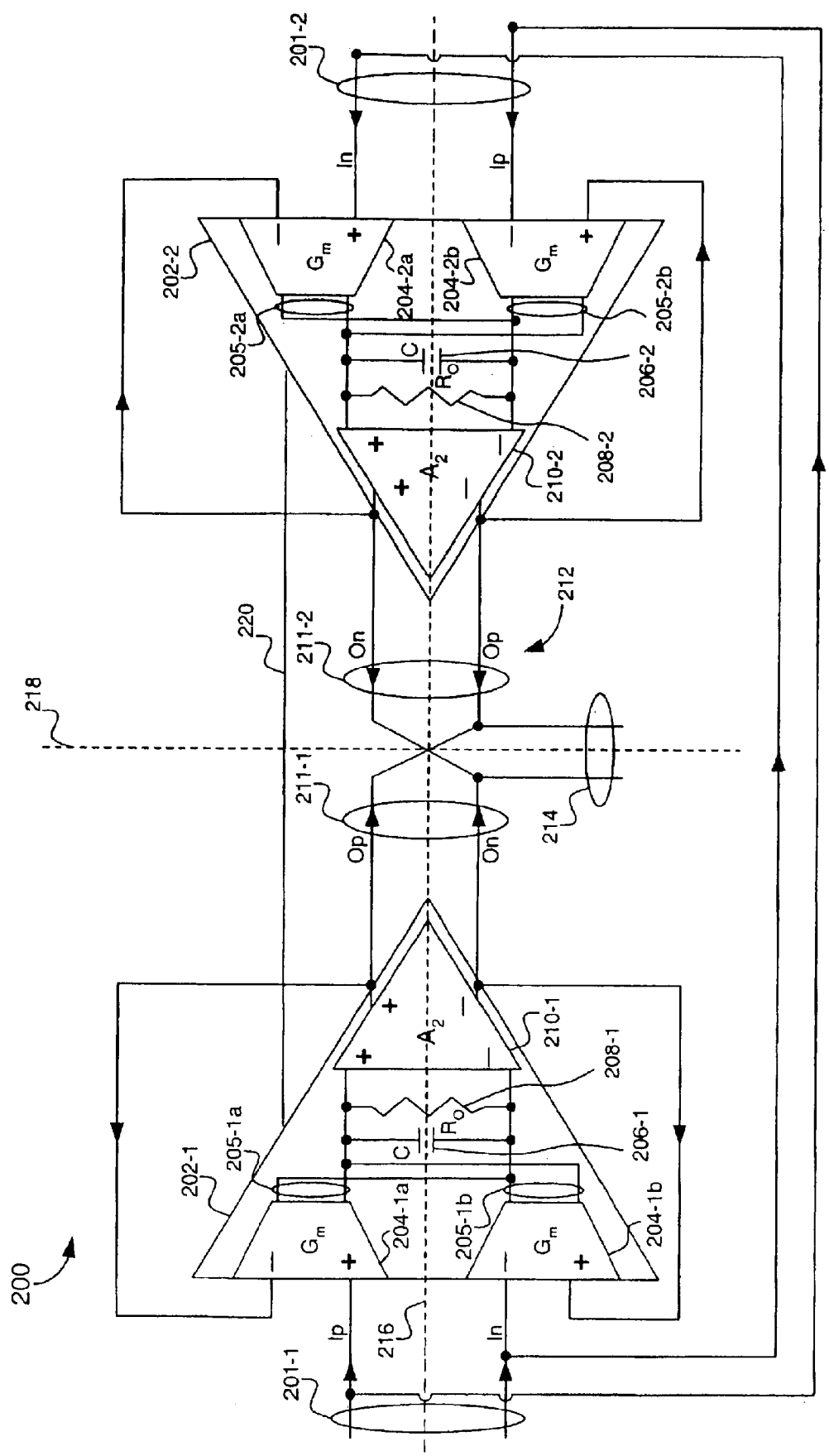
FIG. 2 illustrates an input buffer amplifier with horizontal and vertical symmetry according to embodiments of the present invention.

FIG. 2 illustrates input buffer amplifier 200 according to one embodiment of the present invention. The input buffer amplifier 200 includes two half amplifiers 202-1 and 202-2 that have substantially identical layouts. The buffer amplifier 200 is symmetrical in both the horizontal and the vertical directions. More specifically, the buffer amplifier 200 is symmetrical in the horizontal direction about the vertical symmetry line 218 because the two half amplifiers 202 are identical, mirror images of each other about the symmetry line 218. In the vertical direction, the buffer amplifier 200 is symmetrical about the horizontal symmetry line 216. In effect, the buffer amplifier 200 is symmetrical about two orthogonal lines of symmetry.

Each half amplifier 202 includes two input gain stages 204, a capacitor 206 and a resistor 208 coupled to the output of the gain stages 204, and a second amplifier 210. The components in the first half amplifier 202-1 are given a "-1" designation after their reference number, and the components in the second half amplifier 202-2 are given a "-2" designation after their reference number for ease of discussion.

Each half amplifier 202 is symmetrical in the vertical direction about the horizontal symmetry line 216. For instance, the gain stage 204-1 is arranged so that a stage 204-1*a* is above the horizontal line 216 and a second gain stage 204-1*b* is below the horizontal line 216 in the half amplifier 202-1. The capacitor 206 represents the net Miller effect capacitance of a compensation capacitor(s) that is connected between the differential input and output of the gain stage A2 210, where the compensation capacitor represented by capacitor 206 stabilizes the frequency response of the overall half amplifier 202. Half of the capacitor 206 is above the horizontal line 216 and half of the capacitor 206 is below the horizontal line 216. The resistor 208 is representative of the output resistance of the gain stages 204, and is not really a discreet resistor component. The gain stages 204 are configured so that half the output resistance 208 appears above the horizontal line 216, and the other half of the output resistance 208 appears below the horizontal line 216. The respective components of the half amplifier 202-1 and the half amplifier 202-2 are connected together using a bus 220. More specifically, the terminals of the capacitors 206-1 and 206-2 are connected together by the bus 220. Likewise, the respective output terminals of the gain stages 204-1*a*, 204-1*b*, 204-2*a*, and 204-2*b* are connected together by the bus 220.

Each half amplifier 202 is a mirror image of itself about the horizontal line 216. For instance, in the amplifier 202-1, the top half (above the symmetry line 216) of amplifier 202-1 is a mirror image of the bottom half (below the symmetry line 216). Likewise, in the amplifier 202-2, the top half (above the symmetry line 216) is a mirror image of the bottom half (below the symmetry line 216). As discussed above, each half amplifier 202 is also a mirror image of the other about the vertical symmetry line 218.

The overall horizontal and vertical symmetry of the buffer amplifier 200 improves the device matching between differential signal paths. In other words, the devices in the buffer amplifier 200 that process the positive and negative components of the differential signal are more closely matched. This reduces differential offsets and common mode offsets that can occur when devices are not matched properly. Poor differential matching can also reduce the power supply rejection ratio (PSRR), which increases susceptibility of the receiver to noise.

Each half amplifier 202 receives the input signal 201 having positive and negative components $I_P$ and $I_N$, in-parallel as shown in FIG. 2. The output 211 of each half amplifier 202 is connected together (or wire-ored) at node 212 to form an output for the entire amplifier 200, and to generate an output signal 214. More specifically, the positive output component $O_P$ of the half-amplifier 202-1 is connected with the positive component $O_P$ of the half-amplifier 202-2. Likewise, the negative output component $O_N$ of the half amplifier 202-1 is connected with the negative output component $O_N$ of the half amplifier 202-2. Furthermore, the output $O_P$ and $O_N$ are fed back to the inputs of the half amplifiers 202. For instance, $O_P$ is fed back to the input of gain stage 204-1*a* and 204-2*b* for comparison with the positive input signal $I_P$. $O_N$ is fed back to the input of gain stage 204-1*b* and 204-2*a* for comparison with the negative input signal $I_N$.

The gain stages 204 are differential pair amplifiers that receive a positive or negative component ($I_P$ or $I_N$) of the input signal 201, and the corresponding positive or negative component of the output signal ($O_P$ or $O_N$) of half amplifier 202. The differential pair detects and amplifies the difference between the corresponding inputs and outputs, and generates a differential output signal 205 that is representative of this difference. For instance, in half amplifier 202-1, the gain stage 204-1*a* receives the positive component $I_P$ of the input signal 201, and the positive output component $O_P$ of the output signal 211-1 (since the output 211-1 is fed back to the input of the half amplifier 202-1). The gain stage 204-1*a* then amplifies the difference between these two signals to produce signal 205-1*a*. Likewise, the gain stage 204-1*b* receives the negative component $I_N$ of the input signal 201 and the negative component $O_N$ of the output signal 211-1. The gain stage 204-1*b* then amplifies the difference between these two signals to produce signal 205-1*b*. Likewise, the gain stage 204-2*a* receives the negative component $I_N$ of the input signal 201 and the negative component $O_N$ of the output signal 211-2. The gain stage 204-2*a* then amplifies the difference between these two signals to produce the differential signal 205-2*a*. Likewise, the gain stage 204-2*b* receives the positive component $I_P$ of the input signal 201 and the positive component $O_P$ of the output signal 211-2. The gain stage 204-2b then amplifies the difference between these two signals to produce the differential signal 205-2b.

Still referring to the FIG. 2, the positive and negative components of differential signal 205-1a of the gain stage 204-1a are connected to the corresponding positive and negative components of the differential signal 205-1b of the gain stage 204-1b, so as to form a differential input for the differential amplifier 210-1. Likewise, the positive and negative outputs 205-2a of the gain stage 204-2a are connected to the corresponding positive and negative outputs 205-2b of the gain stage 204-2b to form a differential input for the gain stage 210-2. The overall result of this configuration is described by the following equations:

$$O_P - O_N = [(I_P - O_P) G_m R_o - (I_N - O_N) G_m R_o] A_2 \quad \text{Eq.1}$$

$$O_P - O_N = [(I_P - I_N) G_m R_o - (O_P - O_N) G_m R_o] A_2 \quad \text{Eq.2}$$

where $G_m$ is the gain of the gain stages 204, $R_o$ is the output resistance of the gain, and $A_2$ is the gain of $A_2$ 210. Equations 1 and 2 can be rewritten as:

$$O_P - O_N = (I_P - I_N) G_m R_o A_2 / (1 + G_m R_o A_2) \quad \text{Eq.3}$$

Equation 3 indicates that $O_P - O_N = (I_P - I_N)$ for large $G_m R_o A_2$. In other words, the differential output is equal to the differential input for large $G_m R_o A_2$, or the gain is approximately 1. The amplifiers 210-1 and 210-2 provide some additional differential gain $A_2$.

The half amplifiers 202 can be implemented using field effect transistors (FET) fabricated with a standard CMOS process. Other transistor configurations and processes could also be used.

In embodiments, the gain stage 204-1a and 204-1b are configured in an interdigitated manner so that FET devices of the gain stage 204-1a are interlaced with FET devices of the gain stage 204-1b. As a result, portions of 204-1a and 204-1b appear above and below the horizontal symmetry line 216. Likewise, the gain stage 204-2a and 204-2b are configured in an interdigitated manner so that FET devices of the gain stage 204-2a are interlaced with FET devices of the gain stage 204-2b.

In summary, the input buffer amplifier 200 has been split into two halves 202-1 and 202-2, as shown in FIG. 2. Each of the half amps 202 have substantially identical layouts. All the critical devices in the amp (input differential pairs and all the current sources for the first stage of this two-stage amp) are interdigitated such that there is a line of symmetry along the X direction (Line 216). The two half amps 202 are placed in such a way that they form another line of symmetry along the Y direction (Line 218). In effect, the two half amplifiers 202 are configured to form a mirror image of each other about the line of symmetry along the Y direction (Line 218).

The inputs and outputs of the two half amps 202 are cross-connected in the following manner. The devices in the top section of the left half amp connect to the bottom section of the right half amp to form an input output pair (Ip/Op). The bottom section of the left half amp and top section of the right half amp are connected to form the other input output pair (In/On). This extra step in achieving symmetry helps improve the offset/matching performance of the input buffer circuitry. Several circuit nodes in each amp 202 are connect together by the bus 220 to enable splitting the buffer amplifier 202 into two halves. Furthermore, the input signal 201 is fed to each half 202 in parallel, and the respective outputs $O_P$ and $O_N$ are wire-ored together.

Overall, techniques of centroidal and interdigitation have been taken to the next level by splitting the amplifier 200 into two sections 202. Centroid and interdigitation techniques have been applied to the layout of the amplifier sections 202, as opposed to just applying them to pairs of individual transistors. This further improves the matching performance of the input buffer amplifier and hence helps maintain the offset, noise, and linearity performance of this circuit. Therefore, the actual performance of the input buffer amplifier is closer to what circuit simulations predict, which do not account for the imperfections associated with the layout.

3. Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A buffer amplifier comprising:
   a differential input having a first node and a second node;
   a first half amplifier connected to the differential input, the first half amplifier including:
      a first input differential amplifier connected to the first node, and
      a second input differential amplifier connected to the second node; and
   a second half amplifier connected to the differential input, the second half amplifier including:
      a third input differential amplifier connected to the second node, and
      a fourth input differential amplifier connected to the first node;
   wherein the first input differential amplifier and the third input differential amplifier are configured to be mirror images of each other about a first line of symmetry; and
   wherein the second input differential amplifier and the fourth input differential amplifier are configured to be mirror images of each other about the first line of symmetry.

2. The buffer amplifier of claim 1, wherein the first and second input differential amplifiers are configured to be mirror images of each other about a second line of symmetry, and wherein the third and fourth input differential amplifiers are configured to be mirror images of each other about the second line of symmetry.

3. The buffer amplifier of claim 2, wherein a first combined differential output of the first and second input differential amplifiers has a first output resistance that is configured to be symmetric about the second line of symmetry, and wherein a second combined differential output of the third and fourth input differential amplifiers has a second output resistance that is configured to be symmetric about the second line of symmetry.

4. The buffer amplifier of claim 2, wherein the first line of symmetry is orthogonal to the second line of symmetry.

5. The buffer amplifier of claim 1, wherein the first half amplifier has a first differential output, and wherein the second half amplifier has a second differential output wire-ored to the first differential output.

6. The buffer amplifier of claim 1, wherein the first half amplifier has a first output, and wherein the second half amplifier has a second output cross-connected to the first output to provide a differential output.

7. The buffer amplifier of claim 1, wherein an output of the first input differential amplifier and an output of the second input differential amplifier are connected to provide a first combined differential output, and wherein an output of the third input differential amplifier and an output of the fourth input differential amplifier are connected to provide a second combined differential output.

8. The buffer amplifier of claim 7, wherein the first half amplifier further includes a first output differential amplifier to receive the first combined differential output, and wherein the second half amplifier further includes a second output differential amplifier to receive the second combined differential output.

9. The buffer amplifier of claim 8, wherein the first output differential amplifier provides an output of the first half amplifier, and wherein the second output differential amplifier provides an output of the second half amplifier.

10. The buffer amplifier of claim 8, wherein the first, second, third, and fourth input differential amplifiers and the first and second output differential amplifiers are implemented using a standard complementary metal oxide semiconductor (CMOS) process.

11. The buffer amplifier of claim 1, wherein the first half amplifier has a first output, and wherein the first input differential amplifier is further connected to a first component of the first output, and wherein the second input differential amplifier is further connected to a second component of the first output; and wherein the second half amplifier has a second output, and wherein the third input differential amplifier is further connected to a first component of the second output, and wherein the fourth input differential amplifier is further connected to a second component of the second output.

12. The buffer amplifier of claim 11, wherein the first input differential amplifier amplifies a difference between a signal at the first node and the first component of the first output, and wherein the second input differential amplifier amplifies a difference between a signal at the second node and the second component of the first output; and wherein the third input differential amplifier amplifies a difference between the signal at the second node and the first component of the second output, and wherein the fourth input differential amplifier amplifies a difference between the signal at the first node and the second component of the second output.

13. The buffer amplifier of claim 1, wherein field effect transistors (FETs) of the first input differential amplifier and FETs of the second input differential amplifier are interlaced, and wherein FETs of the third input differential amplifier and FETs of the fourth input differential amplifier are interlaced.

14. A buffer amplifier comprising:
a differential input having a first node and a second node;
a first half amplifier connected to the differential input, the first half amplifier including:
a first amplifier portion connected to the first node, and
a second amplifier portion connected to the second node; and a second half amplifier connected to the differential input, the second half amplifier including:
a third amplifier portion connected to the second node, and
a fourth amplifier portion connected to the first node;
wherein the first amplifier portion and the second amplifier portion are configured to be mirror images of each other about a line of symmetry; and
wherein the third amplifier portion and the fourth amplifier portion are configured to be minor images of each other about the line of symmetry.

15. The buffer amplifier of claim 14, wherein a first combined differential output of the first and second amplifier portions has a first output resistance that is configured to be symmetric about the line of symmetry, and wherein a second combined differential output of the third and fourth amplifier portions has a second output resistance that is configured to be symmetric about the line of symmetry.

16. The buffer amplifier of claim 14, wherein the first half amplifier has a first differential output, and wherein the second half amplifier has a second differential output wire-ored to the first differential output.

17. The buffer amplifier of claim 14, wherein the first half amplifier has a first output, and wherein the second half amplifier has a second output cross-connected to the first output to provide a differential output.

18. The buffer amplifier of claim 14, wherein the first half amplifier has a first output, and wherein the first amplifier portion receives a first component of the first output, and wherein the second amplifier portion receives a second component of the first output; and wherein the second half amplifier has a second output, and wherein the third amplifier portion receives a first component of the second output, and wherein the fourth amplifier portion receives a second component of the second output.

19. The buffer amplifier of claim 18, wherein the first amplifier portion amplifies a difference between a signal at the first node and the first component of the first output, and wherein the second amplifier portion amplifies a difference between a signal at the second node and the second component of the first output; and wherein the third amplifier portion amplifies a difference between the signal at the second node and the first component of the second output, and wherein the fourth amplifier portion amplifies a difference between the signal at the first node and the second component of the second output.

20. The buffer amplifier of claim 14, wherein field effect transistors (FETs) of the first amplifier portion and FETs of the second amplifier portion are interlaced, and wherein FETs of the third amplifier portion and FETs of the fourth amplifier portion are interlaced.

* * * * *